United States Patent [19]

Bolger

[11] Patent Number: 4,500,912
[45] Date of Patent: Feb. 19, 1985

[54] FIR CHROMINANCE BANDPASS SAMPLED DATA FILTER WITH INTERNAL DECIMATION

[75] Inventor: Thomas V. Bolger, Camden, N.J.

[73] Assignee: RCA Corporation, New York, N.Y.

[21] Appl. No.: 405,172

[22] Filed: Aug. 4, 1982

[51] Int. Cl.³ .............................................. H04N 9/535
[52] U.S. Cl. ...................................................... 358/31
[58] Field of Search .................................. 358/31, 323

[56] References Cited

U.S. PATENT DOCUMENTS 3,863,022  1/1975  Bruch ................................. 358/323
4,333,104  6/1982  Geller ................................. 358/31

FOREIGN PATENT DOCUMENTS 22302  4/1980  European Pat. Off. .

OTHER PUBLICATIONS

R. E. Crochiere and L. R. Rabiner, "Interpolation and Decimation of Digital Signals—A Tutorial Review", Proc. IEEE, vol. 69, No. 3, Mar. 1981, pp. 300-331.
D. W. Rorabacher, "Efficient FIR Filter Design for Sample Rate Reduction or Interpolation", Proc. IEEE, Int. Symp. Circuits and Systems, pp. 396-399, Apr. 1975.
D. J. Goodman, et al., "Nine Digital Filters for Decimation and Interpolation", IEEE Trans. Acoustics, Speech and Signal Process, vol. ASSP-25, No. 2, Apr. 1975, pp. 121-126.

Primary Examiner—Richard Murray
Attorney, Agent, or Firm—E. M. Whitacre; P. J. Rasmussen; E. P. Herrmann

[57] ABSTRACT

A sampled data filter for separating chrominance signal from digitized composite video sampled at a $4f_{sc}$ rate produces filtered sampled data chrominance signal at one half the input sample rate. The input video signal occurring as a $4f_{sc}+I, +Q, -I, -Q$ sample sequence is decimated in the filter so that only the filtered replicas of the $+I$ and $+Q$ samples are computed. This effectively doubles the computational time permitted the filter circuitry without substantially compromising signal content.

8 Claims, 5 Drawing Figures

FIR CHROMINANCE BANDPASS SAMPLED DATA FILTER WITH INTERNAL DECIMATION

BACKGROUND OF THE INVENTION

The present invention relates to digital bandpass filters and more particularly to a bandpass filter for extracting chrominance signal from a sampled data TV video signal. The filter is designed to perform digital computations at less than the input signal sample rate by providing a decimated filter chrominance signal relative to the input samples.

In digitally processing TV signals it is frequently required to separate the chrominance and luminance components of the composite TV signal to perform selective processing of the two components. The separation process is normally accomplished by comb filtering the composite signal. In the digital domain it is advantageous to comb filter the signal by selectively combing that part of the composite video signal frequency spectrum containing the chrominance signal component to produce a combined chrominance signal then subtracting the combed chrominance signal from the original composite signal to produce a combed luminance signal.

The chrominance spectral regions of the composite signal is obtained by digitally bandpass filtering the composite signal in a linear phase FIR filter. The sample rate of a digital composite TV signal is at least three times the chrominance subcarrier frequency $f_{sc}$, to satisfy the Nyquist sampling criterion. However, it has been determined, for systems considerations to be more advantageous to use a four times subcarrier sample frequency which for the NTSC system relates to a sample rate of 14.3181818 MHz. It will readily be appreciated by those skilled in the art of FIR digital filter design that a 14.3181818 MHz sample rate imposes severe design constraints on a real time processing FIR digital filter.

The unique nature of composite TV signals however, permits filtering the chrominance signal at less than the composite video sample rate. The composite signal is the sum of a wideband luminance signal and a narrower band subcarrier modulated in quadrature by I and Q color signals.

If the composite video is sampled and digitized by a $4f_{sc}$ sampling circuit with successive sampling points having 57 degree, 147 degree, 237 degree and 327 degree phase relationship to the chroma burst the sequence of samples will correspond to $+I$, $+Q$, $-I$ and $-Q$ related signals. The $-I$ and $-Q$ samples impart substantially no additional chrominance information over that provided by the $+I$ and $+Q$ samples and in general need not be processed. Thus to extract the chrominance information from a digital composite video signal with signal samples occurring at a $4f_{sc}$ rate the filter only has to produce filtered $+I$ and $+Q$ signal samples. As such the number of computations performed by the filter is substantially reduced. A complete $+I$, $+Q$, $-I$ and $-Q$ filtered signal may thereafter be recreated, if desired, by interpolating successive filtered $+I$ samples and successive $+Q$ samples, complementing and time division multiplexing the interpolated samples with the filtered samples in the appropriate sequence.

SUMMARY OF THE INVENTION

The present invention is a bandpass sample data FIR filter for extracting chrominance signals from a composite video signal sampled at four times the subcarrier frequency. The filter comprises a shift register including cascaded signal delay stages having respective output terminals at each stage and clocked to step the sampled signals through the register at the $4f_{sc}$ rate. A Pair of first and second signal storage devices is associated with respective register output terminals and the register signal input terminal. The first storage element of each pair is clocked at an $f_{sc}$ rate and timed to receive the respective I and Q samples from respective register output terminals when a $+I$ sample is present at the register input terminal. The second storage element of each pair is similarly clocked at an $f_{sc}$ rate but timed to accept the respective I and Q samples from the register output terminals when a $+Q$ sample is present at the register input terminal. A coefficient multiplier is associated with each pair of storage elements, each multiplier alternately operating on the signal samples contained in the first and second storage elements at a $2f_{sc}$ rate consecutively producing weighted signal samples from the first storage elements then weighted samples from the second storage elements. An ADDER tree accepts the weighted samples from the respective coefficient multipliers to generate the filtered sequence of output samples $+I_n'$, $+Q_n'$, $+I_{n+1}'$, $+Q_{n+1}'$ ... occurring at a $2f_{sc}$ rate.

DETAILED DESCRIPTION OF THE INVENTION

Figure 1:
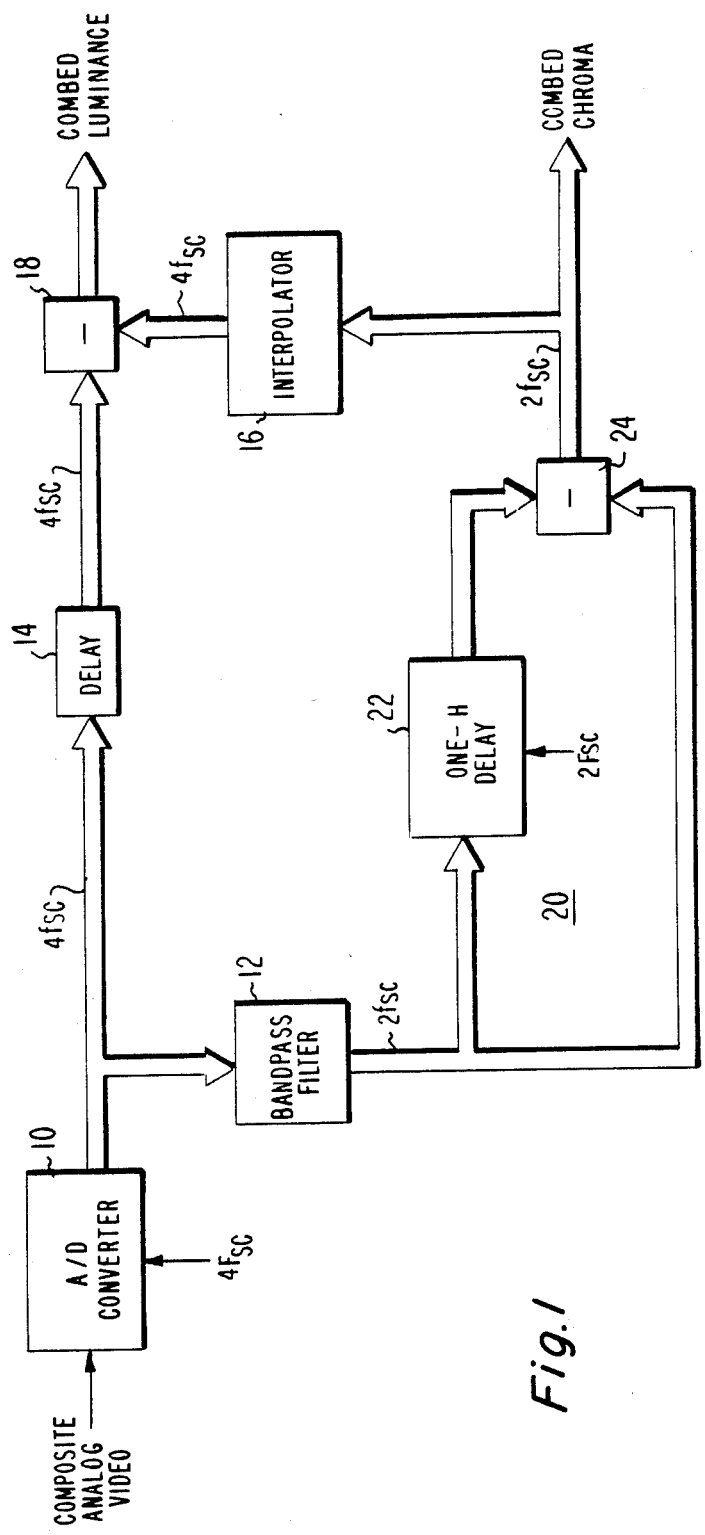
FIG. 1 illustrates in block diagram form a portion of a digital TV processing circuit including a bandpass filter which may be implemented in accordance with the present invention.

Referring to FIG. 1 a portion of the signal processing circuitry in a TV receiver designed to process video signals by digital techniques is shown. More particularly the circuitry illustrated is a comb filter arrangement for separating chrominance and luminance components of composite video signal including a bandpass filter 12 designed in accordance with the principles of the present invention.

In FIG. 1, single-line arrows represent paths for individual signals, and broad arrows represent data paths for multibit digital codewords.

In FIG. 1, a composite analog video signal is applied to the input of an analog-to-digital (A/D) converter 10. The A/D converter samples the analog video signal in response to a sampling signal ($4f_{sc}$) and produces digital video codewords at the sampling signal frequency. In the embodiment of FIG. 1, the sampling signal frequency $4F_{sc}$, is equal to four times the color subcarrier frequency, where $f_{sc}$ is the color subcarrier frequency. In the NTSC color television system in which the color subcarrier frequency is 3.579545 MHz, the $4f_{sc}$ sampling signal frequency is 14.31818 MHz.

The $4f_{sc}$ rate digital codewords produced by the A/D converter 10 are applied to inputs of a delay stage 14 and a digital bandpass filter 12. The passband of the bandpass filter 12 includes the chrominance frequencies which are distributed about the 3.58 MHz color subcarrier frequency in the NTSC system. The delay stage 14 provides an equalizing delay which matches the delays encountered by signals between the input of the bandpass filter 12 and the output of an interpolator 16.

The bandpass filter 12 produces filtered output signals at a clock rate which is lower than that of the input signals to the filter. This may be accomplished, for example, by subsampling the output signals produced by the filter. In the embodiment of FIG. 1, the bandpass filter 12 produces output signals at a $2f_{sc}$ rate, which is half the rate of the input signals to the filter. The $2f_{sc}$ rate of the filtered signals satisfies the Nyquist sampling criterion for the bandwidth of the information-bearing filtered signals.

The $2f_{sc}$ rate filtered signals are applied to a comb filter 20. The comb filter 20 includes a one-H delay line 22, also clocked at the $2f_{sc}$ signal rate, and a subtractor 24. The filtered signals passed by the one-H delay line are applied to one input of the subtractor 24, and undelayed filtered signals are applied to the second input of the subtractor. The subtractor 24 will therefore produce comb filtered chrominance signals at a $2f_{sc}$ clock rate. The comb filtered chrominance signals are now in a form suitable for further processing and display.

The comb filtered chrominance signals are also applied to the input of an interpolator 16. The interpolator 16 interpolates the $2f_{sc}$ chrominance codewords to produce signal values intermediate the $2f_{sc}$ codewords. The output signal of the interpolator thereby comprises combed chrominance signal codewords at the $4f_{sc}$ codeword rate. These $4f_{sc}$ rate combed chrominance signals are applied to one input of a subtractor 18, which also receives $4f_{sc}$ rate codewords passed by the delay stage 14. The subtractor 18 subtracts the comb filtered chrominance codewords from the composite signal codewords passed by the delay stage 14 to produce comb filtered luminance signal codewords. The comb filtered luminance signal is available at the output of the subtractor 18 for subsequent luminance information processing.

The arrangement of FIG. 1 is advantageous in that the comb filter 20 operates at a lower data rate than that of the composite signal produced by the A/D converter 10. This means that the one-H delay of the delay line 22 can be provided by a 55 stage delay line for NTSC signals, instead of the 910 stage delay line required for a $4f_{sc}$ data rate. For example, if the comb filter processes eight bit filtered codewords, only 3640 storage locations are needed in the one-H delay line instead of the 7280 locations required for a $4f_{sc}$ comb filter. The $2f_{sc}$ rate comb filtered chrominance signals are then interpolated back up to the composite signal rate of $4f_{sc}$ and subtracted from the composite signal codewords to produce a comb filtered luminance signal.

Figure 2:
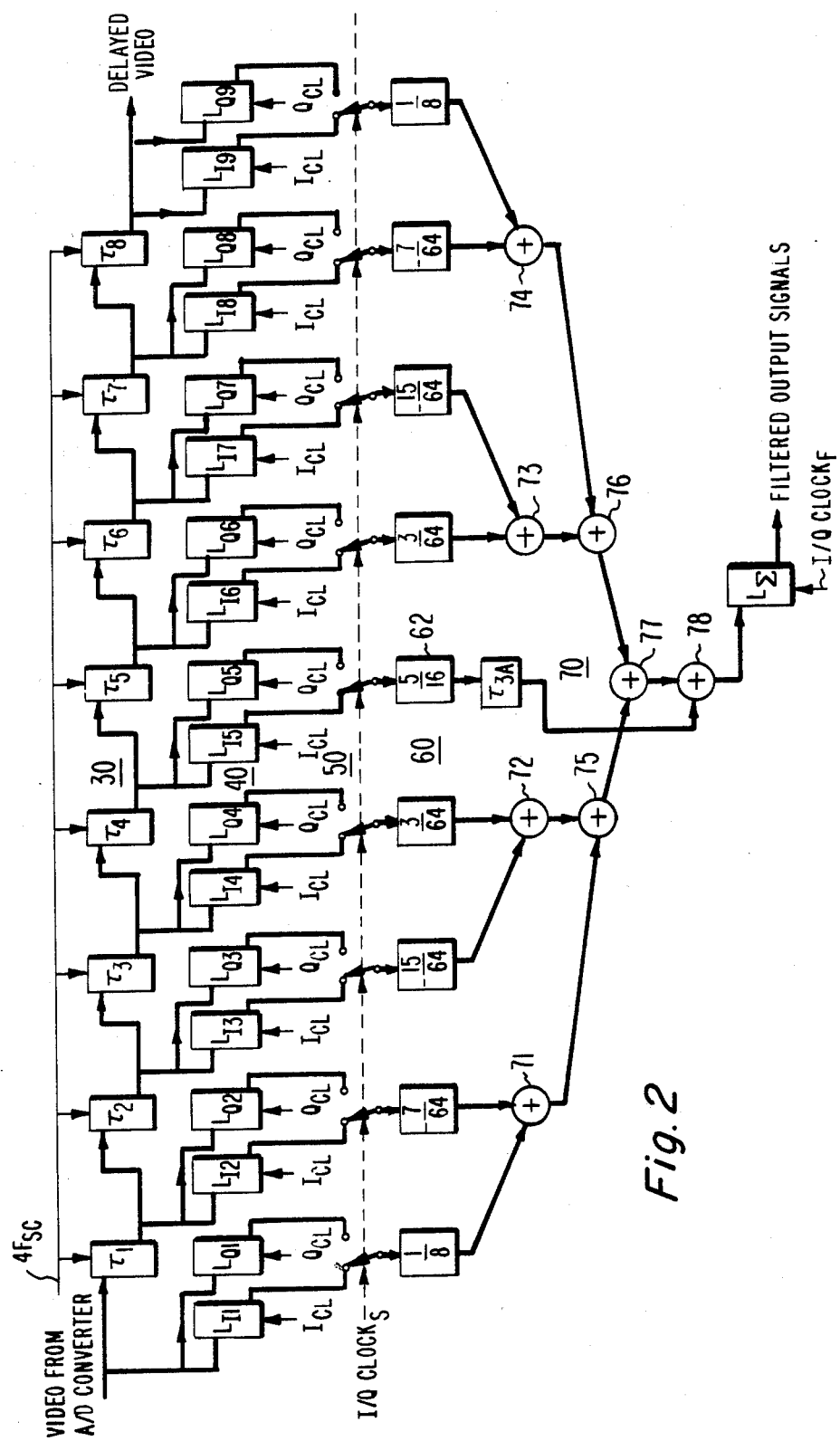
FIG. 2 illustrates in block diagram form a bandpass filter embodying the present invention.
Figure 3:
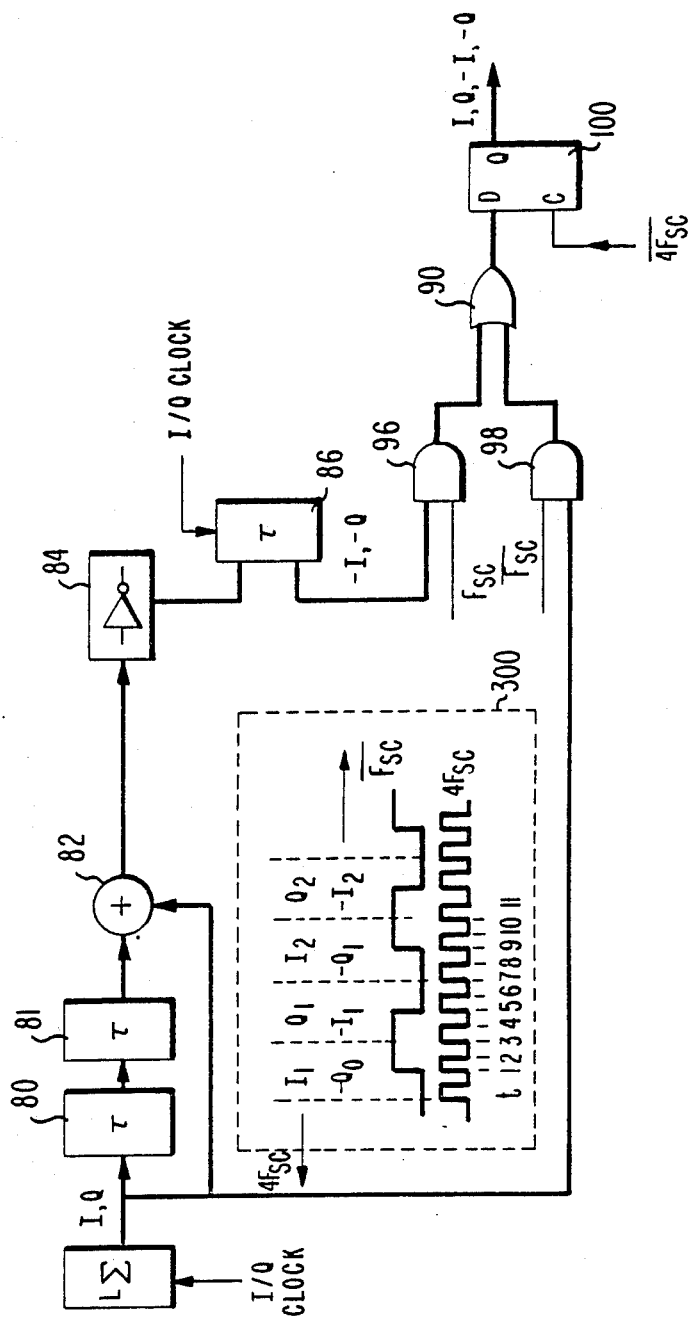
FIG. 3 illustrates in block diagram form an interpolator suitable for restoring the subsampled output signal provided by the FIG. 2 filter to a signal having the full input sample rate.

The bandpass filter 12 is shown in detail in FIG. 2. In FIGS. 2 and 3, broad lines depict data paths for multibit codewords and thin lines depict clock signal paths.

It can be shown that the FIG. 2 filter with the weighting coefficients depicted produces a 3 dB signal passband from 2.35 MHz to 4.2 MHz with the register clocked at $4f_{sc}$. The choice of coefficients was a compromise so that the weighting circuits could be more readily realized with simple binary shift and add circuits.

The filter includes an eight-stage register 30, including delay stages $\tau_1$ through $\tau_8$. Composite video signals produced by the A/D converter 10 are applied to the input of the first stage. Each delay stage is clocked by a $4f_{sc}$ clock signal so as to store a multibit codeword for one cycle of the $4F_{sc}$ clock signal. For instance, if the codewords are eight bits in length, each delay stage will contain eight bits of information. The video signal codewords are clocked sequentially through the register 30. The input of the first stage $t_1$ and the outputs of the remaining stages are coupled to inputs of data latches of a latch register 40.

The latch register 40 includes nine $L_I$ latches labelled $L_{I1}$ through $L_{I9}$, and nine $L_Q$ latches labelled $L_{Q1}$ through $L_{Q9}$. The $L_I$ and $L_Q$ latches are arranged in pairs at the outputs of the shift register stages, with latches $L_{I1}$ and $L_{Q1}$ having their inputs coupled to the input of shift register stage $\tau_1$, latches $L_{I2}$ and $L_{Q2}$ having their inputs coupled to the input of shift register stage $\tau_2$, and so forth. The $L_I$ latches are loaded in parallel by a clock signal $I_{CL}$, and the $L_Q$ latches are loaded in parallel by a second clock signal $Q_{CL}$. The $I_{CL}$ and $Q_{CL}$ clock signals in this embodiment are each of the same frequency, $f_{sc}$, but are of different phases.

The video signal codewords held in the latches 40 are applied to inputs of weighting function circuits 60 by a multiplexer 50. The multiplexer 50, representatively shown in FIG. 2 as an array of switches, alternately couples the outputs of the $L_I$ and $L_Q$ latches to inputs of the weighting function circuits 60. The multiplexer 50 which may be an array of transistors arranged as nine single pole double switches as switched by an I/Q CLOCK$_S$ signal at a $2f_{sc}$ rate.

The weighting function circuits weight the applied signals by respective weights of $\frac{1}{8}$, $-7/64$, $-15/64$, 3/64 and 5/16 as shown in the FIGURE. The weighting function circuits may be constructed using shift matrices and adders as described in U.S. Pat. No. 4,004,140 entitled "Digital Attenuator."

Weighted signal samples produced by the weighting function circuits 60 are applied to an adder tree 70, which sums all of the weighted codewords at the output of the last adder 78 of the adder tree. The output signal of each weighting function circuit except for the center circuit 62 passes through four adders in the tree to reach the output of adder 78. The output of the center circuit 62 passes through only one adder 78, and thus will normally arrive at the output of adder 78 ahead of the other samples of a corresponding point in time. In order to bring the center circuit samples into the same time relationship as the other samples, a delay $\tau_{3\text{-}4}$ equal to the delay of three adder tree adders is inserted in the signal path at the output of the center weighting function circuit. The weighted codewords will thereby be summed in the proper time relationship at the output of the final adder 78. The summed signal samples at the output of adder 78 are then latched into an output latch $L_\Sigma$, which produces filtered output signals at the I/Q clock rate of $2f_{sc}$.

Figure 4:
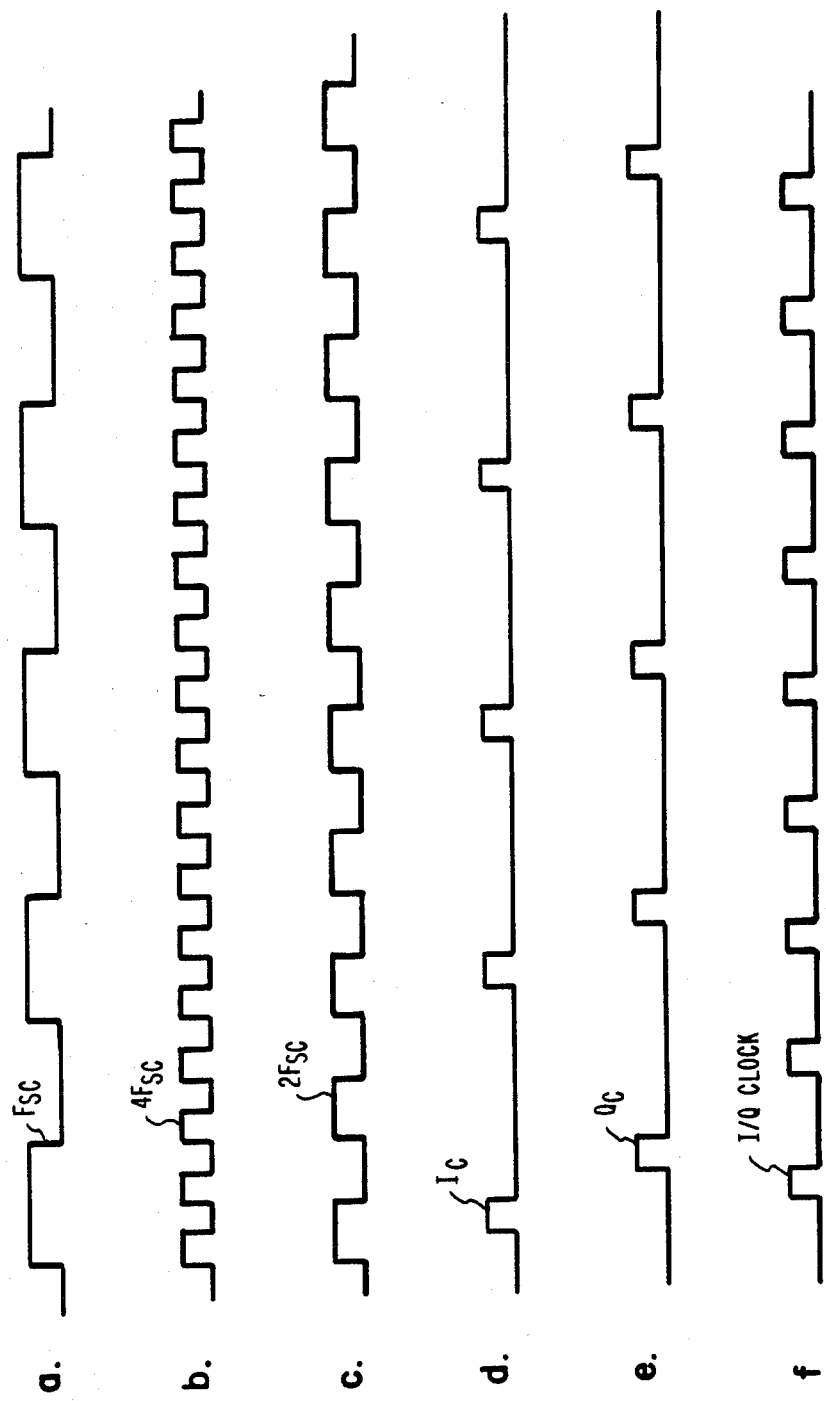
FIG. 4 is a timing diagram showing the instantaneous clocking signals applied at various points in the FIGS. 2 and 3 circuits.

The operation of the bandpass filter of FIG. 2 is explained with reference to FIG. 4, which depicts the clock waveforms applied to operate the filter.

FIG. 4b depicts the clocking signal applied to sequence the signal samples through the register 30. Assume that when the $4f_{sc}$ clock signal is in a high state samples from respective preceding register stages are shifted into respective adjacent succeeding stages and when the clock signal is low the samples are held at their respective stages. Successive input samples to the register are applied at the frequency of the $4f_{sc}$ clock. Each successive input signal sample is clocked from stage $\tau 1$ to stage $\tau 8$ in eight cycles of the $4f_{sc}$ clock.

Composite video signal samples occur in the sequence $I_1$, $Q_1$, $-I_1$, $-Q_1$, $I_2$ ... etc. After eight cycles of the $4f_{sc}$ clock it will be recognized that the register 30 will be loaded from stage $\tau 1$, to $\tau 8$ with the respective signal samples $-Q_2$, $-I_2$, $Q_2$, $I_2$, $-Q_1$, $-I_1$, $Q_1$, $I_1$, and one cycle later with the samples $I_3$, $-Q_2$, $-I_2$, $Q_2$, $I_2$, $-Q_1$, $-I_1$, $Q_1$, etc. The samples in the register are latched into the respective $L_I$ and $L_Q$ latches by the clock signals $I_c$ and $Q_c$ of FIGS. 4d and 4e respectively. The $I_c$ clock is timed to occur each time a $+I_n$ sample is present at the register input. Similarly, the $Q_c$ clock is timed to occur whenever a $+Q_n$ sample is present at the input. As such, the $I_c$ clock will load the latches $L_{I1}$–$L_{I9}$ with the sequence of samples $I_n$, $-Q_{n-1}$, $-I_{n-1}$, $Q_{n-1}$, $I_{n-1}$, $-Q_{n-2}$, $-I_{n-2}$, $Q_{n-2}$, $I_{n-2}$, and the $Q_c$ clock will load the latches with the sequence of samples $Q_n$, $I_n$, $-Q_{n-1}$, $-I_{n-1}$, $Q_{n-1}$, $I_{n-1}$, $-Q_{n-2}$, $-I_{n-2}$, $Q_{n-2}$. The samples latched in the $L_I$ latches are simultaneously applied to the coefficient multipliers 60, one half cycle of the $4f_{sc}$ clock after the $I_c$ clock pulse by the I/Q clock shown in FIG. 4f. Thereafter, the ADDER tree 70 produces filtered output sample $I_n'$ given by:

$$I_n' = \tfrac{1}{2}(I_n) - 7/64(-Q_{n-1}) - 15/64(-I_{n-1}) + 3/64(-Q_{n-1}) + 15/16(I_{n-1}) + 3/64(-Q_{n-2}) - 15/16(-I_{n-2}) - 7/64(Q_{n-2}) + \tfrac{1}{2}(I_{n-2}).$$

Two cycles of the $4f_{sc}$ clock later the I/Q clock applies the contents of the $L_Q$ latches to the multipliers 60 to produce the filtered sample $Q_n'$.

It will be noted that there are no $-I_n$ or $-Q_n$ filtered samples produced by the filter because of the phasing of the $I_c$ and $Q_c$ clocks. The I/Q clock, which pulses at a $2f_{sc}$ rate establishes the output sample rate of the filter at $2f_{sc}$. Thus, only $\tfrac{1}{2}$ of the input samples are filtered which for the timing shown in FIG. 4 are $+I$ and $+Q$ samples—the filtering of the $-I$ and $-Q$ samples being omitted. However, since the $+I$ and $+Q$ filtered samples occur at the $2f_{sc}$ rate, there is sufficient information contained therein to reconstruct the original chrominance signal and substantially no information is lost by failing to filter the $-I$ and $-Q$ samples.

Any combination of two of the four $\pm I$ and $Q$ signal samples may be selected for filtering merely by changing the phasing of the clocks $I_c$ and $Q_c$. For example if the $I_c$ and $Q_c$ clocks are each displaced in time by two cycles of the $4f_{sc}$ clock the $-I$ and $-Q$ samples would be filtered.

The FIG. 2 bandpass chrominance FIR filter, by filtering only two of every four successive signal samples reduces the timing constraints on the coefficient multiplier 60 and adder circuits 70. Thus, a sampled data chrominance bandpass filter for filtering input signals occurring at a $4f_{sc}$ sample rate is more readily realizable in integrated circuit form.

If it is desired to have a filtered chrominance signal with a $4f_{sc}$ sample rate including a I, Q, $-I$ and $-Q$ sample sequence the output signal samples from the FIG. 2 circuit may be applied to an interpolator to generate the $-I$ and $-Q$ samples which are then time division multiplexed with the $+I$ and $+Q$ samples. One such interpolator is shown in FIG. 3.

The interpolator of FIG. 3 implements an algorithm of the form:

$$-I = \frac{\overline{I_1 + I_0}}{2}, \quad -Q = \frac{\overline{Q_1 + Q_0}}{2},$$

where $I_1$ and $Q_1$ are filtered chrominance samples and $I_o$ and $Q_o$ are filtered chrominance samples preceding samples $I_1$ and $Q_1$. A multiplexer then generates a combined chrominance data stream of the form $I_1$, $Q_1$, $-I_1$, $-Q_1$, at a $4f_{sc}$ rate.

In FIG. 3, the output of the bandpass filter latch $L_\Sigma$ is coupled to two delay stages 80 and 81 which are clocked by the I/Q CLOCK signal, and to an input of an adder 82. The output of the second delay stage 81 is coupled to a second input of adder 82. The output of adder 82 is coupled to the input of an two's complementing circuit 84, the output of which is coupled to the input of a delay stage 86. Stage 86 is also clocked by the I/Q clock signal. The output of delay stage 86 is coupled to the input of AND gate 96 and the output of bandpass filter latch $L_\Sigma$ is coupled to the input of AND gate 98. The second inputs of respective AND gates 96 and 98 are coupled to receive respective phase-shifted clock signals $f_{sc}$ and $\overline{f_{sc}}$. The outputs of AND gates 96 and 98 are coupled to inputs of an OR gate 90 to form a multiplexer which produces a filtered chrominance signal at a $4f_{sc}$ rate. The output of OR gate 90 is coupled to the data input of a D-type flip-flop 100 which has its clock input coupled to receive the $4f_{sc}$ clock signal.

The interpolator operates to form interpolated values $-I$ and $-Q$ by adding $+I$ and $+Q$ samples to previous $+I$ and $+Q$ samples, respectively, in adder 82. For instance, when the $L_\Sigma$ latch is applying sample $I_1$ to one input of adder 82, the preceding sample $Q_0$ is held in stage 80 and the preceding sample $I_0$ is held in stage 81 and applied to the second input of the adder 82. The next I/Q clock cycle will apply samples $Q_1$ and $Q_0$ to the adder 82. The adder 82 thus produces consecutive codewords of the form $I_n + I_{n-1}$ and $Q_n + Q_{n-1}$. These codewords are of the same bit length as the input signals to the adder, but exclude the least significant adder output bit. That is, if the input signals to the adder are eight bits in length, the adder produces nine output bits, with the upper eight bits taken as the output codeword. This effects a division of the sum codeword by two. The bits of the adder codewords are then two's complemented, i.e. have their polarity inverted by circuit 84. Interpolated codewords $-I$ and $-Q$ according to the above algorithm are thus produced at the output of the inverting circuit. These codewords are then clocked sequentially into delay stage 86, which produces a sequence of interpolated codewords as shown in the insert 300 of FIG. 3.

The interpolated $-I$ and $-Q$ codewords and the filter output codewords are then multiplexed at a $4f_{sc}$ rate by AND gates 96 and 98 and OR gate 90. Referring to the insert 300 in FIG. 3, at time $t_1$ the $\overline{f_{sc}}$ clock applies codeword $I_1$ to OR gate 90 by way of AND gate 98. At time $t_2$, the $\overline{4f_{sc}}$ clock signal loads $I_1$ into the D-type flip-flop 100. At time $t_3$, codeword $Q_1$ is latched into latch $L_\Sigma$ and applied to OR gate 90 via AND gate 98 enabled by clock $\overline{f_{sc}}$. At time $t_4$ this codeword is loaded into flip-flop 100 by the $\overline{4f_{sc}}$ clock. At time $t_5$ AND gate 96 is enabled by clock $f_{sc}$ and AND gate 98 disabled. Codeword $-I_1$, currently in stage 86 is applied to OR gate 90 via AND gate 96. At time $T_6$ codeword $-I_1$ is loaded into flip-flop 100. At time $t_7$ codeword $-Q_1$ is loaded into stage 86 and applied via AND gate 96 to OR gate 90 and at time $t_8$ is loaded into flip-flop 100 by the $\overline{4f_{sc}}$ clock. In this manner the FIG. 3 circuit produces a filtered sample sequence of I, Q, $-I$, $-Q$, . . . at a $4f_{sc}$ rate.

Figure 5:
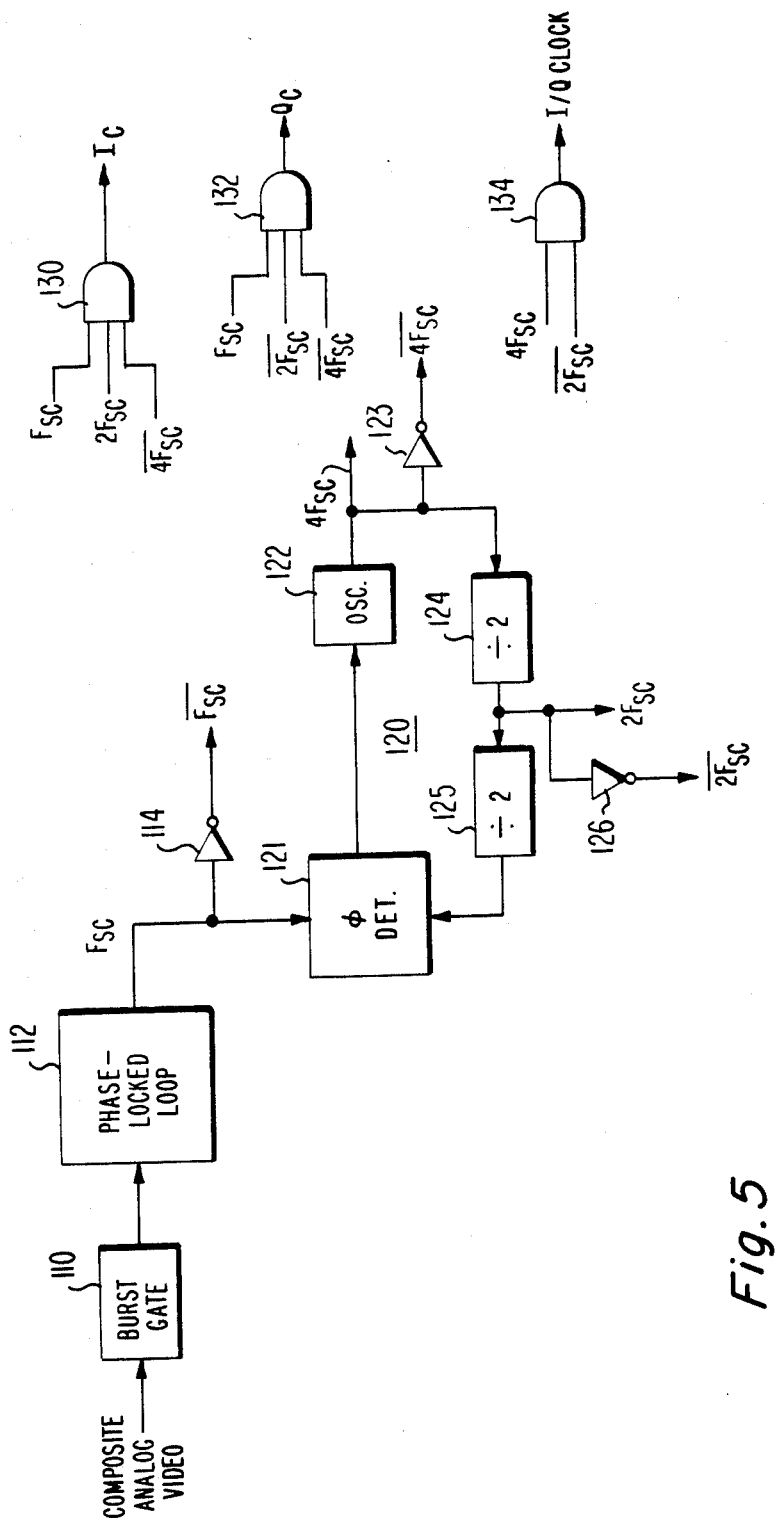
FIG. 5 illustrates in block and logic diagram form, circuitry for generating clocking signals for application to the FIGS. 2 and 3 circuits.

Necessary clock signals for the embodiments of FIGS. 1-3 are produced by the clock generating network of FIG. 5. The composite analog video signal is applied to a burst gate 110 in FIG. 5, which gates the color burst signal to a phase-locked loop 112. The phase-locked loop 112 produces a signal $F_{sc}$ at the color subcarrier frequency phase locked with the color burst signal. An $F_{sc}$ signal waveform is shown in FIG. 4a. For I, Q sampling a delay equal to 57° of the $F_{sc}$ signal is inserted at the output of the phase-locked loop 112 in which case the positive going transitions of the $F_{sc}$ waveform (FIG. 4a) would lag the peaks of the color burst signal by 57° (of one color burst cycle).

An inverter 114 is coupled to receive the $F_{sc}$ signal and produces a complementary signal $\overline{F_{sc}}$ at its output. The $F_{sc}$ signal is also applied to a phase detector 121 of a second phase-locked loop 120. The phase detector 121 produces a control signal to control the phase and frequency of an oscillator 122, which produces a $4F_{sc}$ signal at four times the color subcarrier frequency, as shown in FIG. 4b. The $4F_{sc}$ signal is applied to a divide-by-two circuit 124 and to an inverter 124, the latter producing a complementary $\overline{4F_{sc}}$ signal. The divide-by-two circuit 124 produces a $2F_{sc}$ signal at twice the subcarrier frequency, as shown in FIG. 4c. The $2F_{sc}$ signal is inverted by an inverter 126 to produce a complementary $\overline{2F_{sc}}$ signal. The $2F_{sc}$ signal is also applied to the input of a second divide-by-two circuit 125, which produces an $F_{sc}$ rate signal for the phase detector 121. Thus, the $F_{sc}$, $4F_{sc}$ and $2F_{sc}$ signals and their complements are maintained in substantial phase synchronism.

The $F_{sc}$, $2F_{sc}$ and $\overline{4F_{sc}}$ signals are applied to inputs of an AND gate 130 to produce pulses of an $I_C$ signal when all of the input signals are high, as shown in FIG. 4d. Similarly, the $F_{sc}$, $\overline{2F_{sc}}$ and $\overline{4F_{sc}}$ signals are applied to inputs of an AND gate 132, which produces a $Q_C$ signal as shown in FIG. 4e. The $4F_{sc}$ and $\overline{2F_{sc}}$ signals are applied to inputs of an AND gate 134, to produce an I/Q CLOCK signal, as shown in FIG. 4f. The I/Q CLOCK signal of FIG. 4f is seen to be in the proper phase alignment with the $4F_{sc}$ signal for operation of the bandpass filter, and interpolator of FIGS. 2 and 3 and the $I_C$ and $Q_C$ clock signals are seen to be in the quadrature phase relationship required for the subsampling of the $+I$ and $+Q$ samples by the filter latches of FIG. 2.

By reason of the odd multiple frequency relationship between the line scanning (horizontal synchronizing) frequency and the color subcarrier ($f_{sc}$) frequency, codeword samples on one video line of information are of opposite phase with respect to vertically aligned samples on succeeding and preceding lines. That is, if the first codeword on one line is a $+I$ sample, the first codeword on the next line is a $-I$ sample. This relationship, which underlies the principle of comb filtering, requires that the phases of the $I_{CL}$ and $Q_{CL}$ clock signals be changed from line-to-line so that $+I$ and $+Q$ samples will be selected on one line and combined with vertically aligned $-I$ and $-Q$ samples on the next line. In addition, the interpolator must be operated so that, on the first line, $-I$ and $-Q$ samples are interpolated to fill in between the $+I$ and $+Q$ samples, and that $+I$ and $+Q$ samples are interpolated to fill in between the $-I$ and $-Q$ samples on the following line. Therefore, in order to realize the desired combing function from the circuitry of FIG. 1, utilizing the bandpass filter of FIG. 2 and interpolator of FIG. 3 the clocks $I_c$ and $Q_c$ shown in FIG. 4 must be shifted 180 degrees from line to line and the $F_{sc}$ and $\overline{F_{sc}}$ clocks applied to gates 96 and 98 must be complemented from line to line.

In the foregoing discussion, the signals processed and processing circuitry described were presumed to be digital in nature. However, it will be appreciated by those skilled in the art of signal processing that the techniques and circuitry described apply, in general, to sampled data signals whether in analog or digital form. For example if the FIG. 2 circuitry were to be arranged to filter analog sampled data signals, the register 30 may be an analog charge transfer device having parallel output taps, the $L_I$ and $L_Q$ latches may be capacitors for storing charge, the coefficient multipliers 50 may be analog four quadrant multipliers and the ADDERS may be a resistor network working into the input of an operational amplifier, which input presents a virtual ground potential. Finally, the latch $L_\Sigma$ may be a conventional sample and hold circuit.

In addition a FIR filter of the type illustrated in FIG. 2 may be changed from a bandpass filter to a low pass filter merely by changing the weighting coefficient values. Further, if the weighting coefficients are symmetrical about the center of the register the phase response of the filter is linear. If the coefficients are not symmetrical about the midpoint the phase response, in general, will be nonlinear. In light of these aspects of the illustrative FIR filter of FIG. 2 it can readily be seen that the principles of the invention apply equally to bandpass, low pass, linear phase and nonlinear phase FIR filters.

What is claimed is:
1. A FIR filter comprising:
a shift register for storing and temporally translating signal, having N serially cascaded delay stages, a signal input terminal coupled to the first delay stage of said series of delay stages and N parallel output terminals located at each stage, said shift register being synchronously clocked to process signals applied to said input terminal at a given rate;
M pairs of first and second signal storage elements;
means responsive to a first clocking signal having a clocking rate less than said given rate for simultaneously coupling signal from respective ones of the register input and output terminals to said first storage elements;
means responsive to a second clocking signal having a clocking rate less than said given rate for simultaneously coupling signal from said respective ones of the register input and output terminals to said second stage elements of said pairs respectively;
M coefficient multiplying circuits for weighting signal applied thereto;
multiplexing means for alternately coupling stored signal from the first storage elements of the M pairs of storage elements to respective ones of said M multiplying circuits to the exclusion of stored sig- nal from said second storage elements, and for coupling stored signal from the second storage elements of said M pairs of storage elements to said M multiplying circuits to the exclusion of stored signal from said first storage elements respectively; and means for summing the M weighted signals from said M multiplying circuits.

2. A sampled data filter for providing filtered signal samples at a rate less than the rate at which input signal samples are applied to an input thereof comprising:

a shift register having an input terminal for applying said input signals, and including serially cascaded delay stages and parallel output terminals at ones of said delay stages;

R sets of storage elements for storing signal samples, R being an integer, each set including a plurality of storage elements, each set being responsive to respective clock signals for simultaneously coupling signal from said register output terminals to respective ones of said plurality of storage elements in a particular set, said respective clock signals occurring temporally displaced from each other at a rate less than the input signal sample rate;

a plurality of signal multiplying means for weighting signal applied thereto;

multiplexing means responsive to a further clock signal occurring at a rate less than said input sample rate for simultaneously coupling signal from respective storage elements in a particular set to respective ones of said plurality of signal multiplying means; and means for summing the weighted signals from said plurality of multiplying means, the sums of weighted signals corresponding to output signal from the filter.

3. The sampled data filter set forth in claim 2 wherein the filter input signal is a composite video signal sampled at four times the color subcarrier frequency having samples occurring in a signal sequence corresponding to $+I$, $+Q$, $-I$, $-Q$ samples and wherein the number R of sets of storage elements is 2, a first set thereof being responsive to a clocking signal phase related with each $+I$ sample applied to the register input terminal and the other set being responsive to a clocking signal phase related with each $+Q$ sample applied to the register input terminal.

4. The sampled data filter set forth in claim 3 wherein the filter output samples are in a $+I_n$, $+Q_n$, $+I_{n+1}$, etc. sequence occurring at a rate equal to twice the color subcarrier frequency where the subscript n is an integer.

5. The sampled data filter set forth in claim 2 wherein each of the R sets of storage elements includes one further storage element to which signal is coupled from said register input terminal.

6. The sampled data filter set forth in claim 5 wherein the register contains 8 delay stages, each stage having an output terminal, and said plurality of multiplying means is 9 in number.

7. The sampled data filter set forth in claim 6 wherein the coefficients by which the respective multiplying means weight the signal samples are arranged symmetrically about the midpoint of the register.

8. The sampled data filter set forth in claim 7 wherein the coefficients by which the respective multiplying means weight their respective signal samples, arranged in the order from the register input terminal to the output terminal of the last stage, is $\frac{1}{8}$, $-7/64$, $-15/64$, $3/64$, $5/16$, $3/64$, $-15/64$, $-7/64$, $\frac{1}{8}$.

* * * * *